United States Patent [19]

Alves, III

[11] 3,764,929

[45] Oct. 9, 1973

[54] PUSH-PULL DARLINGTON AMPLIFIER WITH TURN-OFF COMPENSATION

[75] Inventor: Joseph Ferriera Alves, III, Milford, N.J.

[73] Assignee: RCA Corporation, New York, N.Y.

[22] Filed: June 7, 1971

[21] Appl. No.: 150,436

[52] U.S. Cl. ........................ 330/15, 330/24, 330/13, 330/26, 330/19, 330/17

[51] Int. Cl. ............................................. H03f 3/26

[58] Field of Search ...................... 330/13, 15, 38 M, 330/28, 17; 307/315

[56] References Cited

UNITED STATES PATENTS

| | | | |
|---|---|---|---|
| 2,847,519 | 8/1958 | Aronson | 330/13 |
| 3,400,320 | 9/1968 | Ceu | 330/13 |
| 3,526,845 | 9/1970 | Sikorra | 330/13 |
| 3,501,712 | 3/1970 | Webb | 330/15 |
| 3,484,867 | 12/1969 | Babcock | 330/15 |
| 3,399,354 | 8/1968 | Sodtke | 330/13 |
| 3,036,274 | 5/1962 | Greatbatch | 330/15 |
| 3,281,703 | 10/1966 | Bladen | 307/315 X |

OTHER PUBLICATIONS

Publication–Electronic Design 22, Oct. 24, 1968, p. 118, "Complementory Audio Amp. Has Low Distortion–High Output".

*Primary Examiner*—Nathan Kaufman
*Attorney*—Eugene M. Whitacre

[57] ABSTRACT

A resistor and capacitor combination coupled between the base electrodes of opposite conductivity output transistors in a Darlington configuration serves to increase the speed with which these transistors turn-off in response to changes in an applied input signal waveform.

4 Claims, 3 Drawing Figures

INVENTOR.
Joseph F. Alves, III.
BY
Charles Brodsky
ATTORNEY

INVENTOR.
*Joseph F. Alves, III.*
BY
Charles Brodsky
ATTORNEY

PUSH-PULL DARLINGTON AMPLIFIER WITH TURN-OFF COMPENSATION

FIELD OF THE INVENTION

This invention relates to push-pull Darlington type amplifiers, in general, and to a circuit arrangement which extends the available power bandwidth, in particular.

SUMMARY OF THE INVENTION

As will become clear hereinafter, the arrangement of the invention employs a pair of opposite conductivity output transistors, each driven by a further transistor of its like conductivity. A resistor-capacitor combination is coupled between the base electrodes of the output transistors, to assist in turning-off the conducting output transistor in response to a change in the signal waveform applied to the driver devices. Changes in signal waveform in a direction to turn on the previously non-conducting driver transistor cause a corresponding application of such change to be made by means of the resistor to the previously conducting output transistor to increase the speed with which it turns-off. The capacitor is coupled to bypass the resistor to maintain high frequency performance with values of resistance employed to restrict driver circuit power dissipation. When employed together with a feedback arrangement which operates to modify the amplitude of an applied sine wave input signal when the developed output departs from such wave shape due to mis-match between the turn-on drive and turn-off drive applied to the output transistors, the resistor-capacitor arrangement enables construction of push-pull amplifiers having power bandwidths at least to 120 kilohertz. As will be appreciated, such capability is substantially in excess of high frequency performance presently associated with complementary symmetry

BRIEF DESCRIPTION OF THE DRAWINGS

These and other advantages of the invention will become more clearly understood from a consideration of the following description taken in connection with the accompanying drawings in which.

DETAILED DESCRIPTION OF THE DRAWINGS

Figure 1:
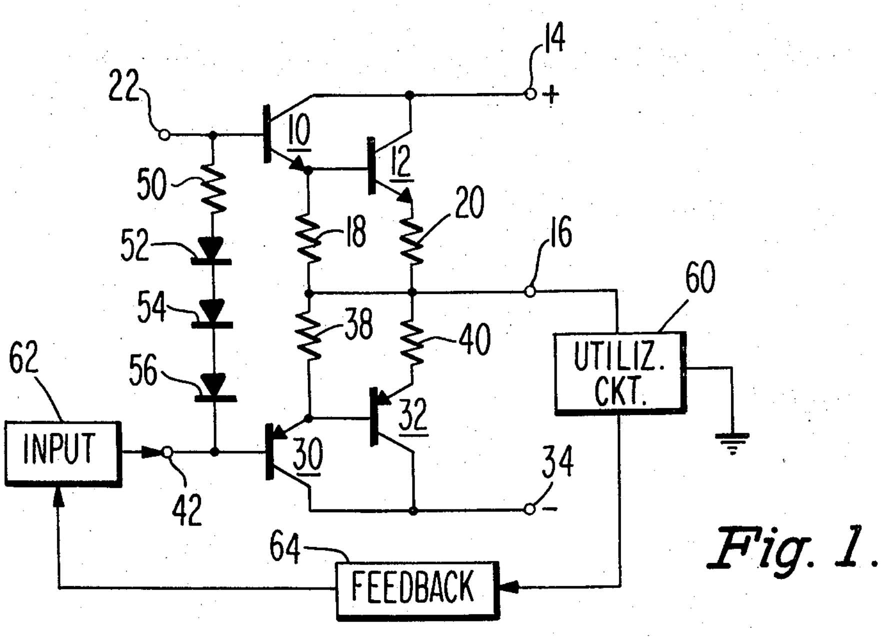
FIG. 1 illustrates, in schematic and block diagram form, a readily available complementary symmetry amplifier.

FIG. 1 illustrates a push-pull Darlington type amplifier employing opposite conductivity transistors. As shown, the upper portion of the amplifier includes a pair of N-P-N transistors 10, 12, each having their collector electrodes connected to a point of positive potential 14 and their emitter electrodes resistively coupled to an output terminal 16. More specifically, a first resistor 18 couples the emitter electrode of transistor 10 to the terminal 16, while a second resistor 20 couples that terminal to the emitter electrode of the transistor 12. The base electrode of transistor 12 is shown directly connected to the emitter electrode of transistor 10, while a similar direct connection exists between that transistor's base electrode and a source of relatively constant current, represented by the terminal 22.

The lower portion of the amplifier circuit of FIG. 1 is substantially similar in nature, but employs a pair of opposite conductivity, or P-N-P, transistors 30, 32 having their collector electrodes coupled to a point of negative potential 34. Resistors 38 and 40 respectively couple the emitter electrodes of transistors 30 and 32 to the output terminal 16, while a direct connection serves to couple the base electrode of transistor 32 to the emitter electrode of transistor 30. The base electrode of that latter transistor is in turn directly connected to an input terminal 42, to which sine-wave voltage signals are typically applied. A fifth resistor 50 and three semiconductor rectifiers 52, 54, 56 serially connect the base electrodes of transistors 10 and 30, with the rectifiers being poled in like manner, the cathode electrode of the rectifier 56 being connected at the base electrode of transistor 30.

With a utilization circuit 60 connected to output terminal 16 and having a connection to an input signal source 62 by means of a feedback network 64, the illustrated configuration is one which is readily available in the art for maintaining a sine-wave output signal by means of controlling the amplitude of the applied input when mis-match occurs between the turn-on drive and turn-off drive to the transistors 12, 32.

To be more specific, such typical amplifier construction usually employs high power output transistors 12, 32 of lower frequency bandwidth and of higher base-to-emitter junction capacity than are associated with their respective input driver transistors 10, 30. With a positive going input signal applied at terminal 42, the upper N-P-N driver transistor 10 is rendered conductive, whereas the lower P-N-P driver transistor 30 is rendered non-conductive. The current which flows through transistor 10 as modified by the applied signal also serves to turn transistor 12 to its ON state so as to develop a positive going sine-wave signal at the output terminal 16. However, because of the higher base-to-emitter electrode capacity of the output transistor 12 and, also, because resistor 18 is unable to supply the same reverse current from the base electrode of transistor 12 as is supplied to it from transistor 10, that transistor 12 serves to resist attempts to turn it OFF after the input signal has reached its maximum value and then decreases to render transistor 10 less-conductive. The utilization circuit 60 together with the feedback network 64, at this time, serve to sense the output signal at terminal 16 thus departing from its preferred sine-wave output, and typically responds to adjust the input drive signal supplied by the source 62 so as to lower the base electrode voltage of the lower P-N-P driver transistor 30 with respect to the load voltage as will bring transistors 30 and 32 into conduction. The intended result is to maintain the sine-wave nature of the output by bringing transistor 32 into conduction at the same time that transistor 12 is resisting attempts to turn it non-conductive.

While the above-described approach proves adequate for maintaining the sine-wave output at frequencies above those normally associated with transistors 12 and 32, it will be noted that both transistors are conductive at the same time. An average current conduction exists across the collector-to-emitter electrodes of these transistors—between the positive and negative potential terminals 14, 34—to undesirably provide a steady state power dissipation in transistors 12, 32 of a magnitude to hinder the available maximum power developable at high frequencies due to the fact that the conducting transistor 12 does not switch fast enough to its non-conducting state. This follows since the only arrangement by which the stored charge at the base electrode of transistor 12 can dissipate is through the resistor 18. It will be readily apparent that the same type of condition exists for the negative portion of the sinewave input, where output transistor 32 also serves to resist attempts to turn it OFF due to its relatively high base-to-emitter electrode junction capacity.

Figure 2:
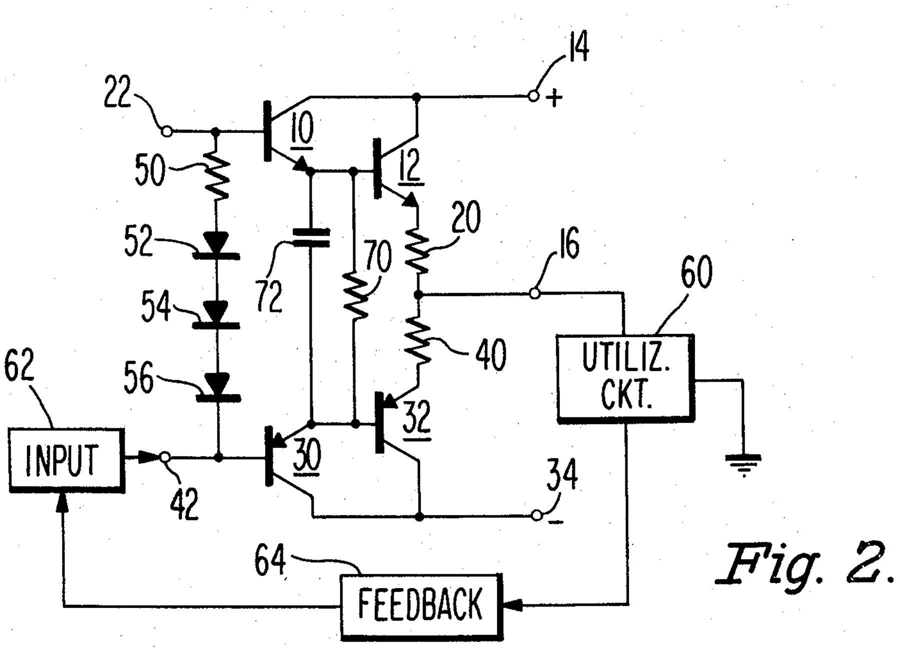
FIG. 2 shows a corresponding amplifier, but embodying the principles of the present invention.

The construction of FIG. 2 embodying the invention, on the other hand, provides a further turn-off drive to the output transistor, assisting this attempt to render it non-conductive. As shown, the arrangement is substantially identical to that of FIG. 1, with the exception that the driver transistor resistors 18, 38 are omitted, and with a resistor-capacitor combination serving as an alternative replacement, according to the invention. That is, a resistor 70 serves to couple the emitter electrode of N-P-N driver transistor 10 to the corresponding emitter electrode of the P-N-P driver transistor 30, along with a capacitor 72 also serving to connect these same two electrodes. With this alternative arrangement, a portion of the negative going drive developed at the emitter electrode of transistor 30 in response to its being rendered conductive by the supplied input signal and by the signal provided by the utilization circuit 60 and feedback connection 64 sensing the departure from the preferred sinewave output is additionally coupled via the resistor 70 to the base electrode of the N-P-N output transistor 12. This coupling of negative voltage provides a further turn-off signal to the transistor 12, even before it is of sufficient magnitude to additionally render P-N-P output transistor 32 conductive. The result will be a substantial lessening in the degree of transistor 12 conduction at the time that the then-applied input signal serves to turn transistor 32 ON. By providing an additional drive through resistor 70, the output transistor 12 is rendered non-conductive more speedily, so that the heretofore problem of excessive dissipation at high frequencies is substantially reduced.

In one construction of the invention it was noted that optimum high frequency performance can be attained by utilizing a resistor 70 of quite low resistance value. However, high power dissipation was noted to result in the driver circuit with such resistor selection. Employment of the capacitor 72 to bypass the resistor 70, on the other hand, was found to maintain the class AB operation of the amplifier and to maintain the high frequency operation with resistor values selected to limit exhibited dissipation.

Figure 3:
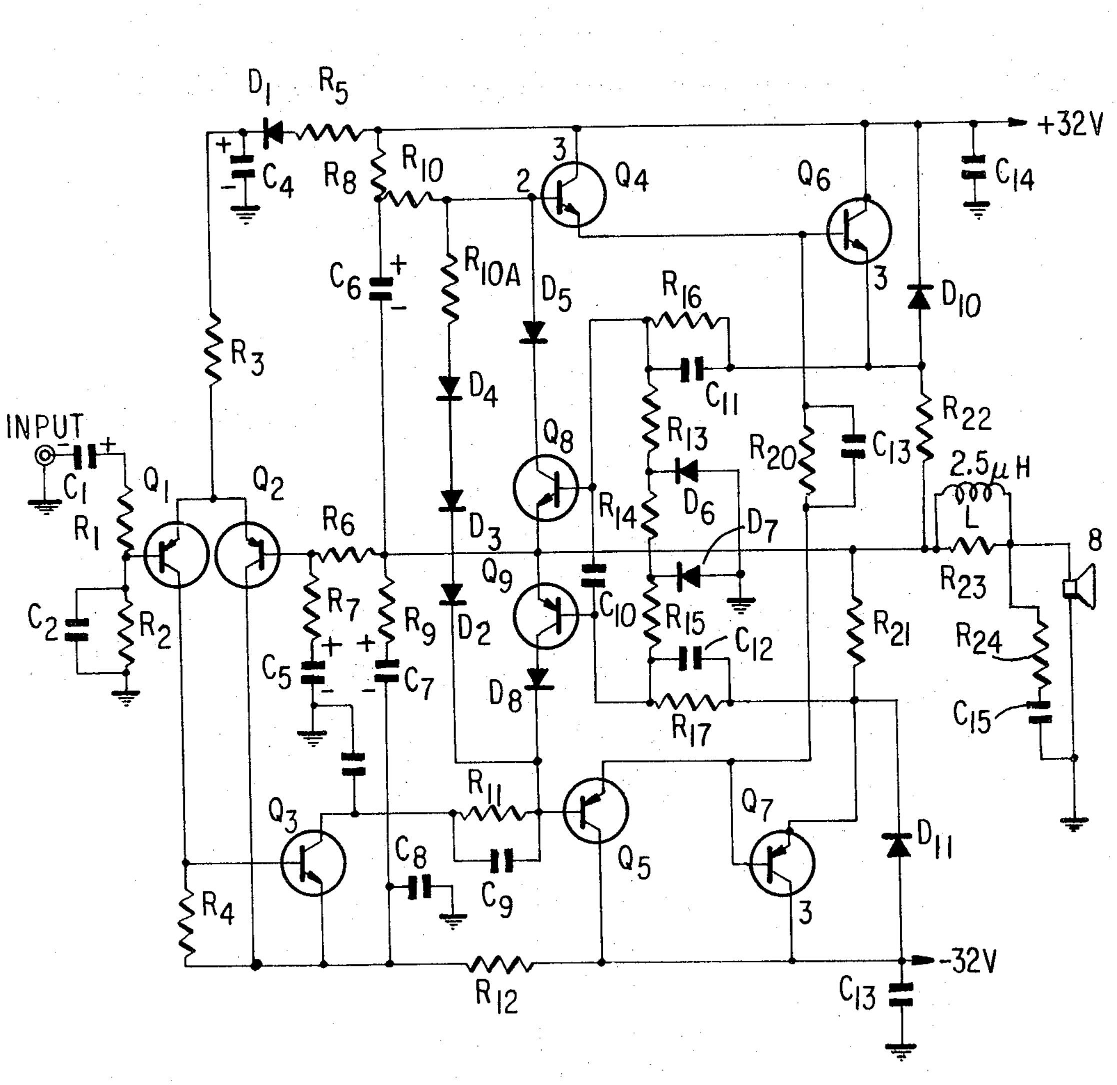
FIG. 3 illustrates an embodiment of the invention as employed in an audio amplifier circuit.

FIG. 3 shows a 40 watt amplifier circuit described in the publication of the Solid State Division of the RCA Corporation under the title "Universal Audio Amplifier-Full Complementary Symmetry Circuit Using Silicon Transistors". Transistors $Q_4$ and $Q_6$ correspond to transistors 10, 12 herein, while transistors $Q_5$ and $Q_7$ correspond to transistors 30, 32. Resistor $R_{20}$ and capacitor $C_{13}$ are equivalent to the components 70, 72 in FIG. 2, with the resistors 20, 40 herein being denoted in that publication as $R_{22}$, $R_{21}$. The utilization circuit 60 and feedback network 64 include, in part, the speaker 8 and the transistor $Q_3$ whereas the coupling network including rectifiers $D_2$, $D_3$, $D_4$ and resistor $R_{10A}$ is the equivalent of the FIG. 2 components 50–56.

While there has been described what is considered to be a preferred embodiment of the present invention, it will be readily apparent that other modifications may be made by those skilled in the art without departing from the teachings herein. Thus, any reading of the claims appended hereto should keep in mind that the use of the unique turn-off drive circuit including the resistor and capacitor connection between the base electrodes of the discrete output transistors serves to provide an outstanding stability of the output units in full-complementary-symmetry amplifiers. As described in that RCA Data Sheet, such resistor-capacitor techniques enables the usage of output hometaxial N-P-N transistors or epitaxial N-P-N transistors, and operating with equal power-bandwidth performance.

What is claimed is:

1. The combination of:

a two transistor amplifier, each transistor having a base and an emitter and a collector electrodes, the emitter electrode of the first of said transistors being connected to the base electrode of the second of said transistors, the collector electrodes of said first and said second transistors being connected to a terminal for application of an operating voltage, and the emitter electrode of said second transistor being coupled to a load circuit;

a third transistor having a base and an emitter and a collector electrode, said third transistor being of a conductivity type complementary to that of said first transistor, the base electrodes of said first and third transistors being direct coupled to a signal input terminal, and the collector electrode of said third transistor being connected to a second terminal for application of an operating voltage; and means for speeding the discharge of the charge accumulated in the base-emitter junction of said second transistor when a signal is applied to said signal input terminal of a sense to tend to decrease the emitter-to-collector resistance of said third transistor and to tend to increase the emitter-to-collector resistance of said first transistor, said means comprising a capacitor of relatively low impedance to said accumulated charge as compared to the emitter-to-collector resistance of said first transistor when increased, said capacitor coupling the base electrode of said second transistor to the emitter electrode of said third transistor for permitting the discharge of said accumulated charge through said emitter-to-collector resistance of said third transistor when decreased.

2. The combination set forth in claim 1 wherein:

a fourth transistor of the same conductivity type as said third transistor is included; said fourth transistor having a base electrode connected to the emitter electrode of said third transistor, an emitter electrode coupled to said load circuit, and a collector electrode connected to said second terminal, whereby said capacitor also serves to speed the discharge of the charge accumulated in the base-emitter junction of said fourth transistor when a signal is applied to said signal input terminal of a sense to tend to turn on said first transistor and to tend to turn off said third transistor.

3. The combination of:

a two transistor amplifier, each transistor having a base, an emitter and a collector electrodes, the emitter electrode of the first of said transistors connected to the base electrode of the second of said transistors, the collector electrodes of said first and said second transistors connected to a terminal for an operating voltage, and the emitter of said second transistor coupled to a load circuit;

a third transistor having a base, an emitter and a collector electrods, said third transistor being of a conductivity type complementary to that of said first transistor, the base electrodes of said first and third transistors connected to a signal input terminal, and the collector electrode of said third transistor connected to a second terminal for an operating voltage; and means for quickly discharging the charge accumulated in the base-emitter junction of said second transistor, when a signal is applied to said signal input terminal of a sense to tend to turn on said third transistor and to tend to turn off said first transistor, said means including path means exhibiting a relatively high impedance for direct-current and a bilateral relatively low impedance for signal variations, said path means connecting the base of said second transistor to the emitter of said third transistor for permitting the discharge of said accumulated charge through the emitter-to-collector path of said third transistor.

4. The combination set forth in claim 3 wherein said path means comprises:

a resistive element, and a capacitor in parallel combination with said resistive element.

* * * * *

Disclaimer 3,764,929.—*Joseph Ferriera Alves III*, Milford, N.J. PUSH-PULL DARLINGTON AMPLIFIER WITH TURN-OFF COMPENSATION. Patent dated Oct. 9, 1973. Disclaimer filed Mar. 15, 1976, by the assignee, *RCA Corporation.*

Hereby disclaims the remaining term of said patent.

[*Official Gazette May 4, 1976.*]